(12) United States Patent
Nabetani et al.

(10) Patent No.: US 7,259,559 B2
(45) Date of Patent: Aug. 21, 2007

(54) COIL ELEMENT SELECTION METHOD AND MAGNETIC RESONANCE IMAGING APPARATUS

(75) Inventors: Akira Nabetani, Tokyo (JP); Atsushi Nozaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/312,099

(22) Filed: Dec. 20, 2005

(65) Prior Publication Data

US 2006/0152220 A1  Jul. 13, 2006

(30) Foreign Application Priority Data

Dec. 22, 2004  (JP)  ............................. 2004-371941

(51) Int. Cl.
*G01V 3/00* (2006.01)
(52) U.S. Cl. ..................................... 324/309; 324/307
(58) Field of Classification Search ................ 324/309, 324/307
See application file for complete search history.

(56) References Cited

U.S. PATENT DOCUMENTS

| | | | |
|---|---|---|---|
| 6,029,082 A * | 2/2000 | Srinivasan et al. | ......... 600/422 |
| 6,097,186 A | 8/2000 | Nabetani | |
| 6,134,465 A * | 10/2000 | Frederick et al. | ........... 600/410 |
| 6,253,101 B1 | 6/2001 | Seng et al. | |
| 6,348,794 B1 | 2/2002 | Nabetani et al. | |
| 6,597,173 B1 * | 7/2003 | Bernstein | ................... 324/318 |
| 6,618,610 B2 | 9/2003 | Nabetani | |
| 6,791,328 B1 | 9/2004 | Nabetani et al. | |
| 6,836,117 B2 | 12/2004 | Tamura et al. | |
| 2001/0028222 A1 | 10/2001 | Nabetani | |
| 2002/0181753 A1 * | 12/2002 | Ma et al. | ..................... 382/131 |
| 2002/0186870 A1 * | 12/2002 | Ma et al. | ..................... 382/131 |
| 2003/0184292 A1 | 10/2003 | Meyer et al. | |
| 2003/0197508 A1 | 10/2003 | Tamura et al. | |
| 2005/0237056 A1 | 10/2005 | Nabetani | |

FOREIGN PATENT DOCUMENTS

EP        0487201 A1      5/1992

(Continued)

OTHER PUBLICATIONS

EP Complete Search Report; Place of Search: Munich; Reference No. 171311/11169; App No. 05257695.6-2209; 9 pgs.

(Continued)

*Primary Examiner*—Brij Shrivastav
*Assistant Examiner*—Megann E Vaughn
(74) *Attorney, Agent, or Firm*—Armstrong Teasdale LLP (57) ABSTRACT

To visually, readily and positively performing the selection of a coil element and a combination of coil elements most suitable for the MRI scan, a low resolution imaging step for imaging at a low resolution by using a plurality of coil elements A to H, an imaging coil element selection step for selecting the optimum coil element for imaging site from the low resolution images taken in the low resolution imaging step, and a coil element extraction step for extracting coil element selected in the imaging coil element selection step are comprised such that a low resolution image of the subject is preliminarily taken to use thereby to visually select the coil element.

16 Claims, 6 Drawing Sheets

FOREIGN PATENT DOCUMENTS

| | | |
|---|---|---|
| EP | 1249708 A1 | 10/2002 |
| EP | 1371327 A1 | 12/2003 |
| JP | 2002-248089 | 9/2002 |
| JP | 2002-355233 | 12/2002 |

OTHER PUBLICATIONS

Grosu, Daniel S., M.D.; Eight RF Receiver Channels and the Integrated Panoramic Array Concept: Pushing the Limits of MR Imaging; Seimens Medical Solutions; 4 pgs.

* cited by examiner

COIL ELEMENT SELECTION METHOD AND MAGNETIC RESONANCE IMAGING APPARATUS

CROSS REFERENCE TO RELATED APPLICATIONS

This application claims the benefit of Japanese Application No. 2004-371941 filed Dec. 22, 2004.

BACKGROUND OF THE INVENTION

The present invention relates to an emission coil for emitting electromagnetic waves of a predetermined frequency to an RF coil mounted on a subject being carried in a static magnetic field and an MRI apparatus for imaging a magnetic resonance image by receiving a magnetic resonance signal emitted from the subject, and more specifically to a method of coil element selection of a magnetic resonance imaging apparatus which allows selecting the optimum coil element suitable for MR measurement from within a plurality of coils embedded in a phased array coil, in accordance with the lesion to be imaged.

There has been known a magnetic resonance imaging apparatus (MRI apparatus herein below) for imaging the internal structure of a subject to be imaged by means of magnetic resonance phenomenon hitherto. Since the magnetic resonance phenomenon is harmless to a living body, the MRI apparatus is useful in medical field and used in the detailed examination of whole body system and in the diagnosis of brain tumor.

The magnetic resonance phenomenon is a phenomenon that, in an object having a uniform static field applied, the spin axis of nuclei of atoms constituting an object aligns to absorb and release the electromagnetic waves of a frequency in proportion to the intensity of static field. The MRI apparatus uses the magnetic resonance phenomenon with respect to a specific specie of nuclei (primarily to hydrogen atoms) to image a given section of the object being imaged at a given thickness.

For the RF coil in the MRI apparatus, hitherto, a phased array coil is used, which may have a larger imaging area without the need of elongating the imaging time for the MRI diagnosis. In this case, it is needed to select the coil element that is in position suitable for the object being imaged (because of the highest sensitivity in the imaging area) from within a plurality of coil elements constituting the phased array coil, in order to perform the imaging with the coil element.

In practice, a manufacturer of medical apparatus fixes in advance the combination of which coil elements to be used from within the coil elements constituting the phased array coil, and notifies the imaging technician of the coil sensitivity of each combination prior to the practical use.

More specifically, the imaging technician selects a combination of coils which is best suited to a clinical use, on the basis of the information and his/her experience, or changes the combination of coil elements if there is discrepancy with the imaging area, or changes and adjusts the relative position of the subject to the coil in order to achieve the MRI imaging.

As the Prior Art of this field, for example that disclosed in the patent reference 1, there is disclosed a technique of magnetic resonance imaging method by selecting an optimum combination of RF receiver coils in accordance with the imaging section, combining the signals received with the RF receiver coils in response to the combination selected, and eliminating unnecessary part of image with a matrix computation by using thus bound signals. Also in the patent reference 2, there is disclosed a technique of determining a coil with the maximum available sensitivity to be selected and a coil with the minimum available sensitivity to be omitted, based on the determination of corresponding index gauge collected during the preliminary scan with respect to a plurality of coils selected in advance.

Patent reference 1: JP-A-2002-248089
Patent reference 2: JP-A-2002-355233

The MRI apparatus of the prior art as have been described above, however, may have the problems as cited below. More specifically, the MRI apparatus of the prior art, as stated above, requires the adjustment of position of the phased array coil to be mounted on the subject based on the experience of the imaging technician in order to achieve the MRI imaging.

However, as the number of channels constituting the phased array coil increases, the degree of freedom that which elements (constituting coils) of a phased array coil to be selected also increases. This poses a problem of difficulty of selecting the optimum coil element most suitable for the practical MRI measurement.

In other words, the sensitivity direction of coil elements is fixed to a predefined direction in accordance with the form of each respective coil. In order to adjust the sensitivity direction of coil element therefore a work is needed for changing the coil element disposition, leading to a problem that the burden of the amount of work of the imaging technician and physician increases, as well as to another troublesome problem that after having an MRI imaging session, the MRI imaging should be run again if the mounting position of phased array coil is not appropriate.

SUMMARY OF THE INVENTION

Therefore, the present invention has an object to provide a method of coil element selection of a magnetic resonance imaging apparatus, which allows selecting in an easier and positive manner the coil element and a combination of coil elements most suitable to the MRI imaging by the imaging technician operating the MRI apparatus.

In order to solve the problems and to achieve the object, the present invention in first aspect provides a coil element selection method of a magnetic resonance imaging apparatus for generating a magnetic resonance image based on magnetic resonance signals emitted from a site being imaged of a subject through a phased array coil mounted on the subject and having a plurality of coil elements embedded, the method comprising: a coil element selection step for selecting the coil element having the most suitable imaging sensitivity with respect to the site to be imaged of the subject by any coil element of the plurality of coil elements, wherein the coil element selection step includes: a low resolution imaging step for imaging at a lower resolution by using the plurality of coil elements; an imaging coil element selection step for selecting the most suitable imaging coil element for the site to be imaged based on a plurality of low resolution images taken in the low resolution imaging step; and a coil element extraction step for extracting the coil element selected in the imaging coil element selection step.

The present invention in second aspect provides a coil element selection method in accordance with the first aspect, in which the imaging coil element selection step enables selecting a combination of a plurality of coil elements with the most suitable imaging sensitivity with respect to the imaging site of the subject.

The present invention in third aspect provides a coil element selection method in accordance with first or second aspect, further comprising an imaging condition setting step for setting the imaging condition when imaging with the coil element extracted in the coil element extraction step.

The present invention in fourth aspect provides a coil element selection method in accordance with any one of the first, second or third aspect, further comprising an imaging slice plane setting step for allowing selection of setting in any one imaging slice plane of axial, sagittal, and coronal with respect to the subject.

The present invention in fifth aspect provides a coil element selection method in accordance with any one of the first through fourth aspect described above, in which the low resolution imaging step includes a function of performing the process of imaging a sensitivity area by the plurality of coil elements.

The present invention in sixth aspect provides a coil element selection method in accordance with any one of the first through fifth aspect described above, in which the low resolution imaging step includes a function of using the imaging method of moving cradle together.

The present invention in seventh aspect provides a magnetic resonance imaging apparatus which generates a magnetic resonance image based on the magnetic resonance signals emitted from an imaging site of a subject by means of a phased array coil to be mounted onto the subject and having a plurality of coil elements, the magnetic resonance imaging apparatus comprising: a coil element selection means for selecting an optimum coil element which is most suitable for the imaging sensitivity with respect to the imaging site of the subject, by any coil element of the plurality of coil elements, as well as a low resolution imaging means for imaging at a lower resolution by using the plurality of coil elements, an imaging coil element selection means for selecting the imaging coil element which is most suitable for the imaging site from within a plurality of low resolution images taken by the low resolution imaging means, and a coil element extraction means for extracting the coil element selected by the imaging coil element selection means.

The present invention in eighth aspect provides a magnetic resonance imaging apparatus in accordance with the seventh aspect, in which the imaging coil element selection means enables selecting a combination of a plurality of coil elements with the most suitable imaging sensitivity with respect to the imaging site of the subject.

The present invention in ninth aspect provides a magnetic resonance imaging apparatus in accordance with the seventh or eighth aspect above, further comprising an imaging condition setting means for setting an imaging condition at imaging with the coil element extracted in the coil element extracting means.

The present invention in tenth aspect provides a magnetic resonance imaging apparatus in accordance with the seventh, eighth or ninth aspect above, further comprising an imaging slice plane setting means for allowing selection of setting in any one imaging slice plane of axial, sagittal, and coronal with respect to the subject.

The present invention in eleventh aspect provides a magnetic resonance imaging apparatus in accordance with the tenth aspect above, further comprising a slice section display means for displaying the slice section imaged in any one of imaging slice planes set by the imaging slice plane setting means.

The present invention in twelfth aspect provides a magnetic resonance imaging apparatus in accordance with the tenth or eleventh aspect above, in which the imaging slice plane setting means includes a function of setting imaging position to the optimum position based on the imaging slice plane set by any one imaging slice plane of axial, sagittal, and coronal.

The present invention in thirteenth aspect provides a magnetic resonance imaging apparatus in accordance with any one of the seventh through twelfth aspect above, in which the low resolution imaging means includes a function of performing the process of imaging a sensitivity area by the plurality of coil elements.

The present invention in fourteenth aspect provides a magnetic resonance imaging apparatus in accordance with any one of the seventh through thirteenth aspect, in which the low resolution imaging means includes a function of using the imaging method of moving cradle together.

The present invention in fifteenth aspect provides a magnetic resonance imaging apparatus in accordance with any one of the seventh through fourteenth aspect above, further comprising a standard coil element selection means for selecting a coil element configuration, which is the reference to the coil elements.

The present invention in sixteenth aspect provides a magnetic resonance imaging apparatus in accordance with the fifteenth aspect above, further comprising a coil element display means for displaying the configuration of standard coil element set by the standard coil element selection means.

In accordance with the present invention, the coil element selection step includes a function of selecting the optimum coil element which is the most suitable for the imaging sensitivity with respect to the imaging site of a subject by any coil element of a plurality of coil elements constituting the phased array coil; the coil element selection step includes the low resolution imaging step for imaging at low resolution by means of a plurality of coil elements, the imaging channel selection step for selecting the imaging channel which is the most suitable for the imaging site from within a plurality of low resolution images taken by the low resolution imaging step, and the coil element extraction step for extracting the coil element selected by the imaging channel selection step, so that the position of imaging site can be visually recognized in an efficient and positive manner in a shorter time, as well as the coil element which is candidate of imaging at a higher sensitivity the imaging site can be determined from within a plurality of coil elements.

By providing a coil element selection method that is intuitive and easy to understand for the imaging technician, the present invention has the effect that the operator may readily select a coil element appropriate for the purpose while at the same time decreasing the retaking of MRI shoots, and that improves the efficiency of MRI diagnosis.

The coil element selection method and magnetic resonance imaging apparatus in accordance with the present invention is obviously useful for MRI apparatus, more specifically for, among others, the coil element selection method in which the technician is allowed readily and positively selecting either a coil element and a combination of coil elements, most suitable for the MRI imaging.

Further objects and advantages of the present invention will be apparent from the following description of the preferred embodiments of the invention as illustrated in the accompanying drawings.

DETAILED DESCRIPTION OF THE INVENTION

By referring to accompanying drawings, some preferred embodiments of the coil element selection method and the magnetic resonance imaging apparatus in accordance with the present invention will be described in greater details herein below. In the following description, the overview and feature of the system configuration for carrying out the coil element selection method and the magnetic resonance imaging apparatus in accordance with first preferred embodiment will be described first, then the processes of coil element selection method will be described in greater details thereafter.

PREFERRED EMBODIMENTS

Figure 1:
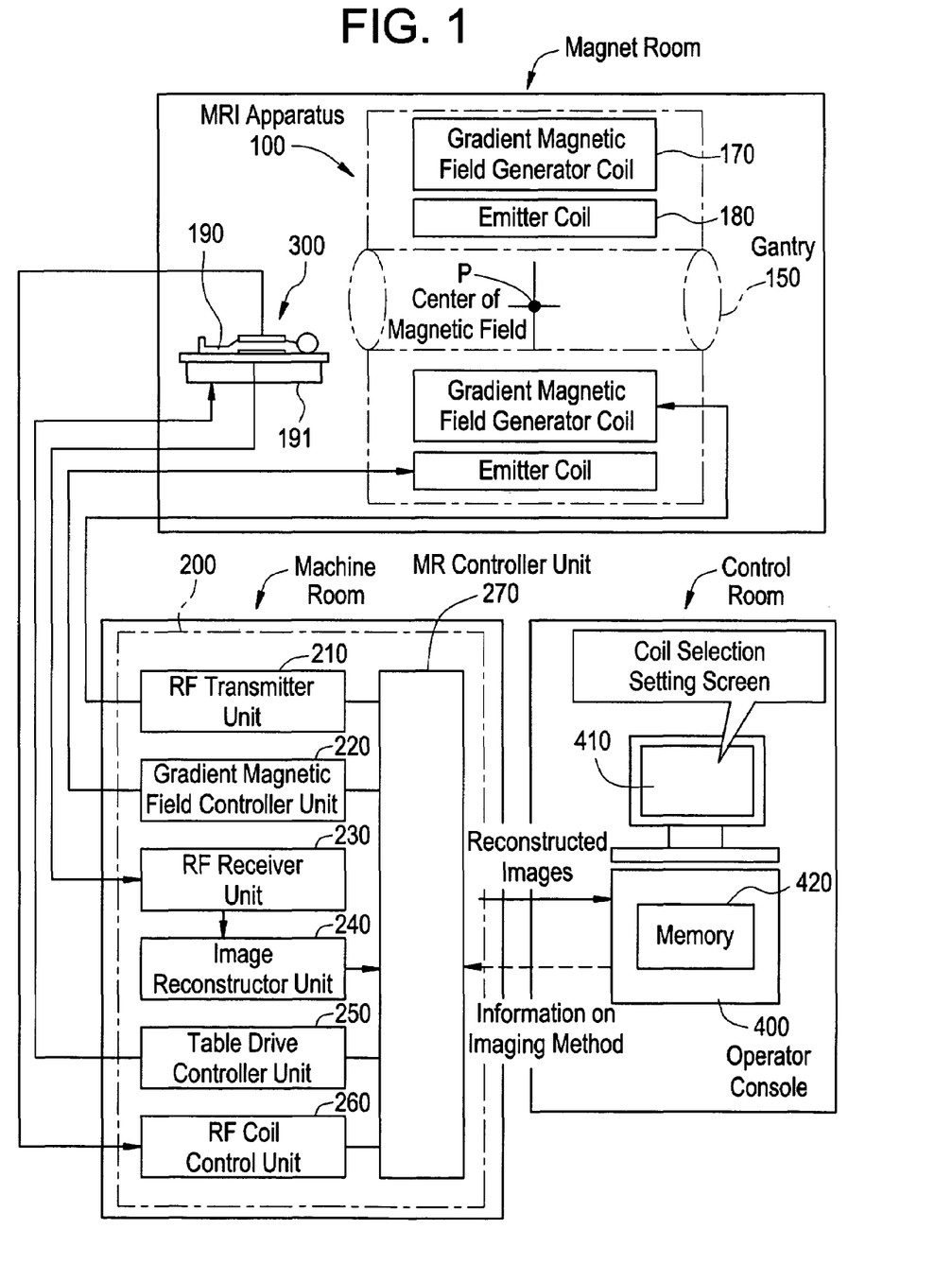
FIG. 1 shows an exemplary embodiment of system structure for carrying out the coil element selection method in accordance with the present invention.

FIG. 1 shows a functional schematic block diagram indicative of an exemplary system configuration for carrying out the coil element selection method in accordance with the present invention. The feature of the coil element selection method of the present invention is such that low resolution images of the subject will be taken in advance to thereby use those low resolution images taken in advance to visually select a coil element.

More specifically, as shown in FIG. 1, the inventive system includes a magnet room incorporating an MRI apparatus 100 for imaging the imaging site of a subject, a machine room incorporating an MRI controller apparatus 200 for controlling the imaging operation of the MRI apparatus 100, and an operation room incorporating an operator console 400 (computer) operated by the imaging technician (operator). The MRI imaging of a subject by using the MRI apparatus 100 may be performed by the technician operating the operator console 400 in the control room to control the MRI controller apparatus 200 in the machine room.

An image reconstructed from low resolution images is sent from the MRI controller apparatus 200 of the machine room to the operator console 400 in the control room, and information on the imaging method set by the technician with the coil element selection display screen 500 (see FIG. 5) is sent, based on the low resolution images stored in a memory 420 previously sent from the MRI controller apparatus 200.

More practically, the MRI apparatus 100 is used to image at a low resolution the subject in a preliminary imaging path in the range sufficiently encompassing the coil sensitivity distribution by the phased array coil, then the low resolution images thus taken are stored in the memory 420 of the operator console 400, then the information on the coil element selected by the imaging technician at the time of coil element selection is used to reconstruct images in the scanning plan, so that the technician can intuitively recognize which part of the subject is imaged by the selected coil.

In other words, the coil element selection display screen 500 (see FIG. 5) is used to visually select any of coil elements A to H (see FIG. 3B) among a plurality of coil elements A to H constituting the phased array coil 300 or a combination of some of coil elements A to H to find the optimum imaging sensitivity with respect to the imaging site of the subject. The MRI apparatus 100 installed in the magnet room, the MRI controller apparatus 200 installed in the machine room, and the operator console 400 installed in the control room and operated by the imaging technician, which constitute the inventive system, will be described in greater details.

(Structure of the MRI Apparatus 100)

As shown in FIG. 1, the gantry 150, which constitutes the MRI apparatus 100, in the order from the outermost, contains a gradient magnetic field generator coil 170 for generating a gradient magnetic field, and an emitter coil 180 in the form of cylinder for emitting the predetermined electromagnetic waves to the subject carried into the static magnetic field. The MRI apparatus 100 may have the capability of obtain low resolution images in such a method as moving cradle by imaging in the range encompassing the sensitivity area of all coils in the phased array coil 300.

A table 191 is allowed to enter inside of the emitter coil 180, carrying the subject 190 (patient). Around the abdomen of the subject 190 a phased array coil 300 is placed in which a plurality of (eight in this embodiment) coil elements A to H are embedded (see FIG. 3A and FIG. 3B). The details of the phased array coil 300 will be described later.

(Structure of the MRI Controller Apparatus 200)

As shown in FIG. 1, the MRI controller apparatus 200, which controls the MRI apparatus 100, includes an RF transmitter unit 210, a gradient magnetic field controller unit 220, an RF receiver unit 230, an image reconstructor unit 240, a table drive controller unit 250, and an RF coil control unit 260.

The RF transmitter unit 210 has the capability of emitting high frequency electromagnetic waves from the emitter coil 180 in order to cause a nuclear magnetic resonance phenomenon in atomic nuclei that constitute living tissue.

The gradient magnetic field controller unit 220 which is connected to the gradient magnetic field generator coil 170 in the MRI apparatus 100 has the capability of supplying power to the gradient magnetic field generator coil 170 to apply gradient magnetic field in the magnet assembly.

The RF receiver unit 230 has the capability of receiving the electromagnetic waves from the phased array coil 300. The image reconstructor unit 240 has the capability of image generation by reconstructing and generating an MRI image, based on the electromagnetic waves received by the RF receiver unit 230.

The table drive controller unit 250 has the capability of transport the table 191 until the center position (FIG. 3A) of the phased array coil 300 mounted on the subject becomes to match the magnetic field center P (see FIG. 1) of the magnet assembly. The RF coil control unit 260 has the capability of controlling the bias in order to control the switches on the phased array coil with the bias to select active coil element. More specifically, it has the capability of controlling which coil to receive NMR signal among the coil elements and the coil to go to disabling mode.

(Structure of the Operator Console 400)

As shown in FIG. 1, the control room incorporates the operator console 400 for the imaging technician to operate, and the operator console 400 includes a display unit 410 (monitor), and a memory 420. The display unit 410 has the capability of displaying the coil element selection display screen 500 (see FIG. 5) for visually selecting coil elements. The operator console 400 also includes an input unit (such as mouse and keyboard) for receiving various instruction input from the technician. As have been described above, to the operator console 400 in the control room are sent reconstructed images (low resolution images) from the MRI controller apparatus 200 in the machine room.

In addition, since, as have been described above, the feature of the present invention is that the low resolution images of a subject is preliminarily imaged and the low resolution images thus imaged preliminarily are used to visually select coil elements, the present invention has the capability of using the information from the coil element selected when the imaging technician has selected the coil element (low resolution images of the subject) to image reconstruct in accordance with the scanning plan (coil element selection process).

Figure 2:
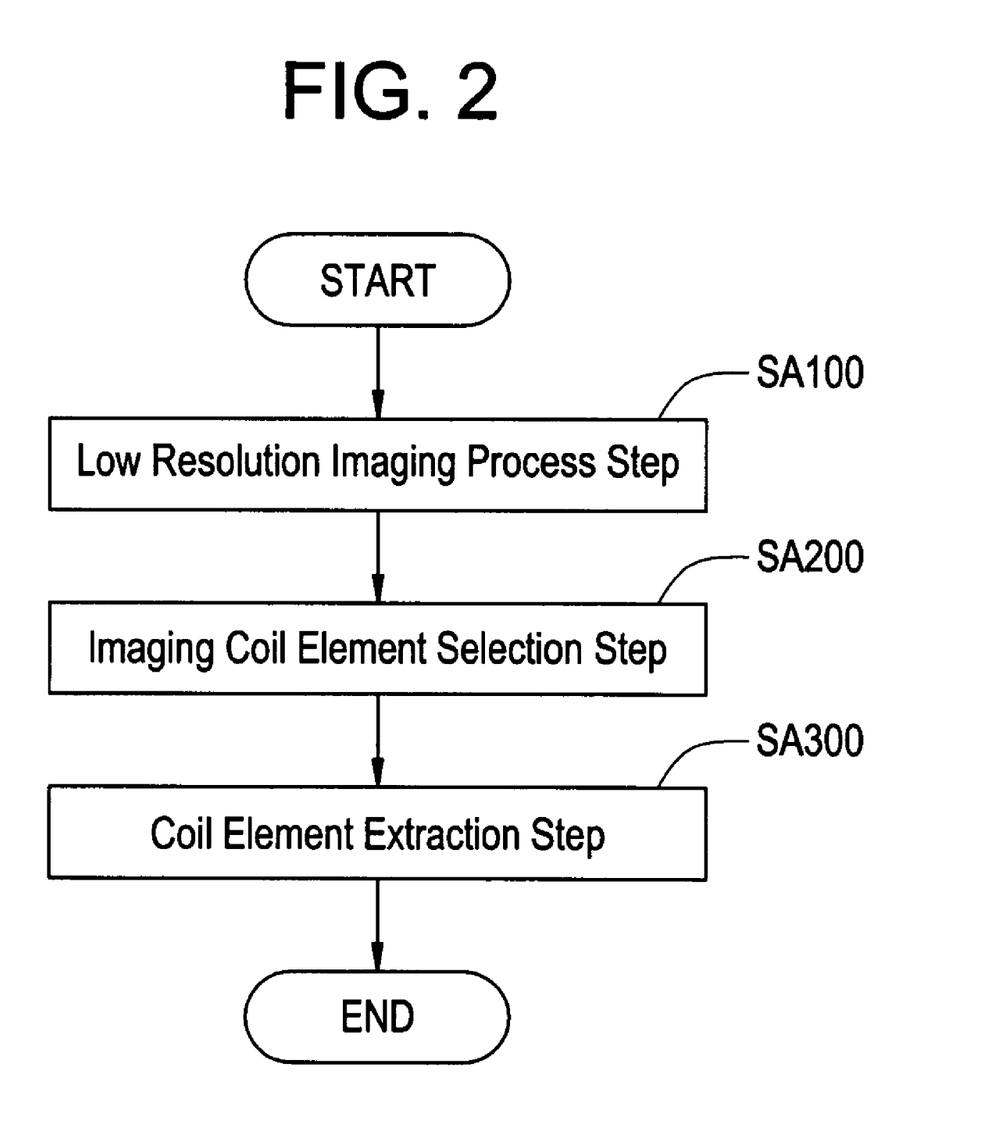
FIG. 2 shows a flow chart illustrating the fundamental process sequence in accordance with the coil element selection method.

FIG. 2 shows a fundamental flow chart of the coil element selection process in accordance with the preferred embodiment. As shown in FIG. 2, the coil element selection process is constituted of a low resolution imaging process step (SA100) for imaging low resolution images by using a plurality of coil elements, an imaging coil element selection step (SA200) for selecting imaging coil element such that the imaging site becomes optimum based on a plurality of low resolution images taken in the low resolution imaging process step, and a coil element extraction step (SA300) for extracting the coil element selected in the imaging coil element selection step.

The low resolution imaging process step is just similar to the low resolution imaging process in the conventional system, however in accordance with the present invention, the low resolution image processing using all of a plurality of coil elements A to H which constitutes the phased array coil 300 will take images of the site to be imaged of the subject 190 while at the same time requiring to determine the sensitivity of all coils, so that the images should be taken by dividing the session into plural paths so as to encompass the sensitivity range of coil elements.

As will be described later, in the first preferred embodiment the imaging in the low resolution image processing step with the coil elements A to H may be performed by any imaging method such as the moving cradle method and the like, which allows imaging during table displacement when the subject 190 is transported to the magnet center. In the first preferred embodiment, applying low resolution imaging allows obtaining necessary information in a shorter time. In addition, the present invention allows the technician to readily determine whether or not the combination of channels thus selected (channel 1 to channel 8) based on the image data taken in the low resolution image processing step is appropriate to his/her intention.

Figure 3A:
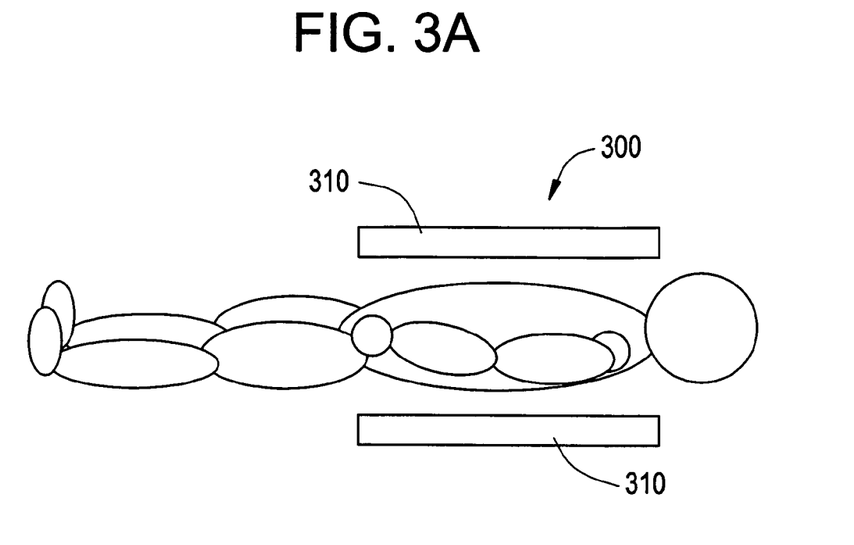
FIG. 3A shows a vertical cross sectional view indicating the phased array coil to be installed on a subject.
Figure 3B:
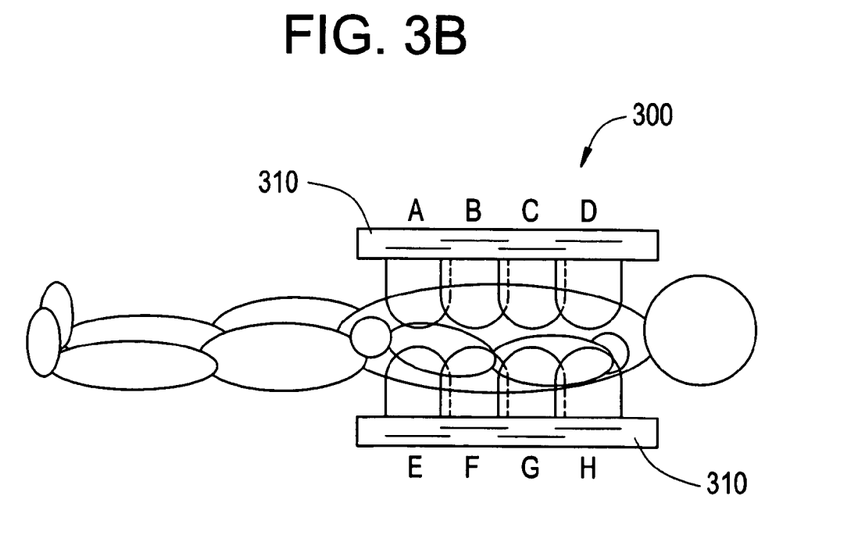
FIG. 3B shows a vertical cross sectional view indicating the arrangement of coil elements and their sensitivity range.

When using the moving cradle method, coil elements A to H to be selected may be switched therebetween appropriately in connection to the movement of the table 191. More specifically, in such a manner the relative coil sensitivity range with respect to the subject 190 by the coil elements A to H can be obtained. For instance, in case of the phased array coil 300 with 8 channels as shown in FIG. 3B, along with the progress (movement) of the table 191, as if imaging with each coil elements A to H, the subject will be imaged by changing the coil elements A to H to be used in response to the movement of the table 191.

(Structure and Function of the Phased Array Coil 300)

Now the structure and function of the phased array coil 300 will be described in greater details with reference to FIG. 3A and FIG. 3B. FIG. 3A shows a cross sectional view indicative of the overview of the phased array coil 300 to be mounted on a subject; FIG. 3B shows an overview of the sensitive area of a plurality of (eight elements in FIG. 3B) coil elements A to H. As shown in the figure, the phased array coil 300 is deployed over and beneath the abdomen of the subject 190, and is constituted of covers 310, 310. The coil structure shown is merely an example, the fundamental structure is similar in any other coils.

In the cover 310 constituting the phased array coil 300, a plurality of coil elements A to H are embedded. In addition in the figure, the part of sensitive area of the phased array coil 300 that overlaps with the subject indicates the sensitivity of respective coil elements A to H.

There is a mark that indicates the center of coil on the center of the phased array coil 300. In the following description, an embodiment including the cover 310 placed on top of the subject with four coil elements A, B, C, and D embedded, and the cover 310 placed beneath the subject with four coil elements E, F, G, and H embedded will be described.

(Detailed Structure and Function of the Coil Element Selection Display Screen 500)

Figure 4:
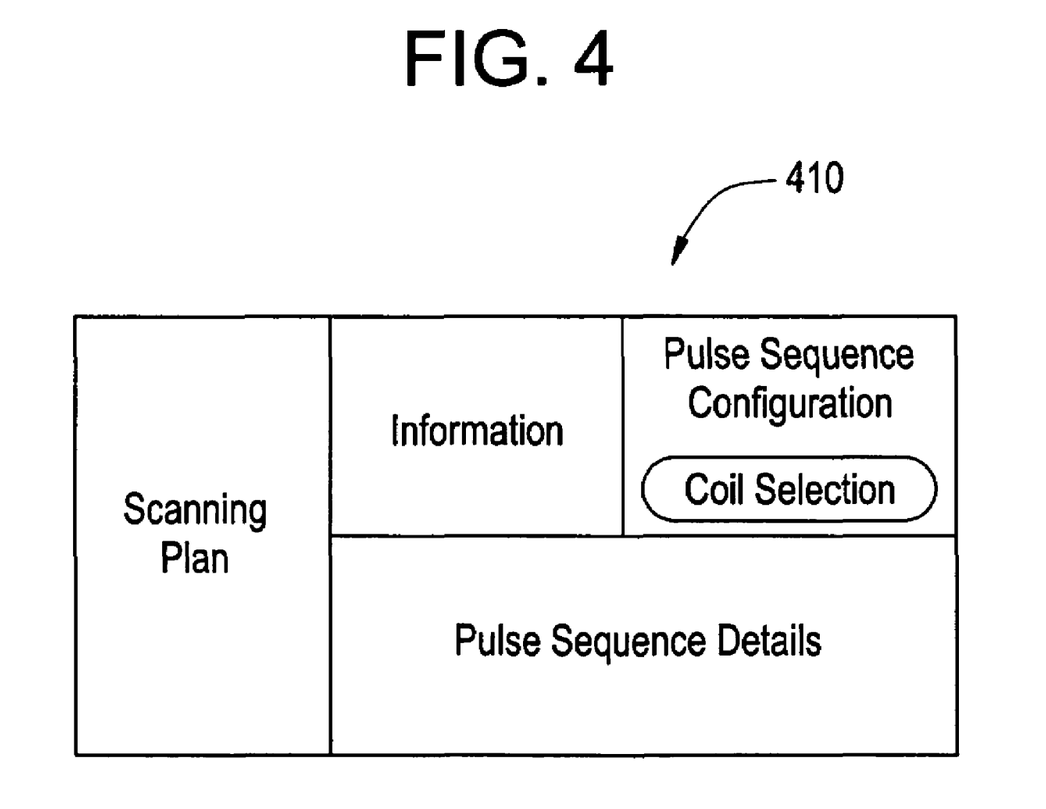
FIG. 4 shows an exemplary embodiment of menu screen displayed on the display unit (monitor).
Figure 5:
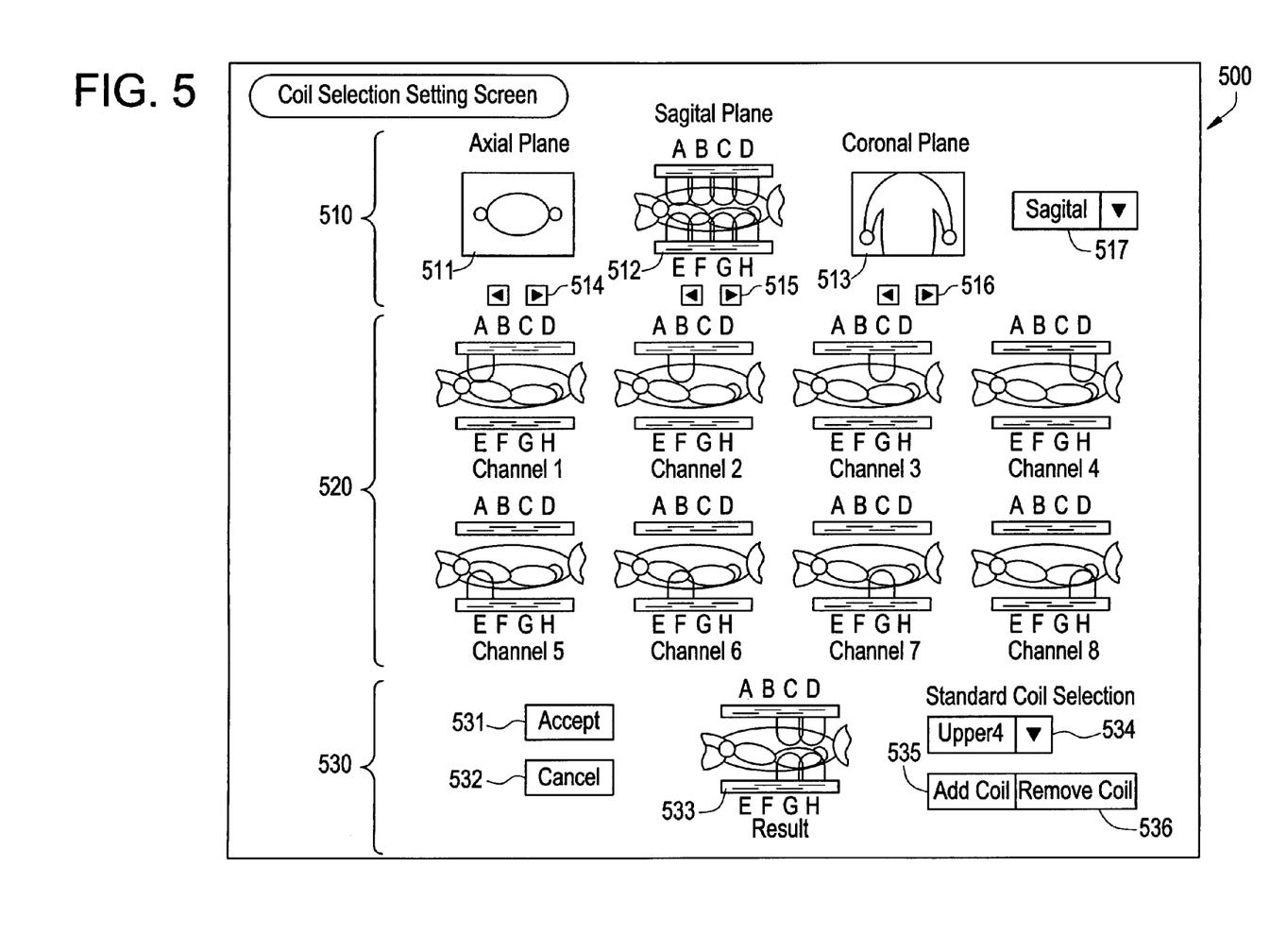
FIG. 5 shows an exemplary embodiment of display of coil element selection setting screen.

Now referring to FIG. 4 and FIG. 5, the coil element selection display screen 500 will be described in greater details. FIG. 5 shows an exemplary embodiment of the display unit 410 (see FIG. 1) of the operator console 400 installed in the control room. More specifically, the coil element selection display screen 500 can be displayed by the imaging technician selecting the icon "coil select" on the operating display screen shown on the display unit 410 (monitor) by the mouse, as shown in FIG. 4, and from the coil element selection display screen 500, any coil elements A to H can be selected and set such that the imaging sensitivity is optimum (higher sensitivity) with respect to the imaging site of the subject 190.

(Structure and Function of the Coil Element Selection display Screen 500)

As shown in FIG. 5, the coil element selection display screen 500 has a slice sectional display area 510 arranged on top side where a plurality of (three) image slice sections are displayed, a low resolution image display area 520 arranged on the middle, a coil element selection image display area 530 arranged on bottom side, and the slice sectional display area 510 has the capability of readily selecting the imaging site of plural sections (three patterns). In this embodiment, the sagittal plane set window 512 of the slice sectional display area 510 may display one single large image that is synthesized by the system standard image reconstruction method from the low resolution images taken by eight coil elements A to H (the image combining the imaging sensitivity signal from the coil elements A to H).

In the slice sectional display area 510 (localizer) there are placed an axial plane setting window 511 (axial plane), a sagittal plane setting window 512 (sagittal plane), and a coronal plane setting window 513, the optimum imaging slice plane that is suitable for imaging the site to be imaged can be displayed by appropriately selecting either one of three imaging slice planes.

The localizer is an area in which necessary screen is displayed when setting a slice to be scanned; the axial plane is defined as the plane that splits the human body into upper (head) and lower (leg) parts; the sagittal plane is defined as the plane that split the human body into left and right halves; and the coronal plane is defined as the plane along with the longitudinal axis, splitting the human body into frontal (sagittal) and back (occipital) halves.

In the coil element selection display screen 500 shown in FIG. 5, by operating the imaging slice plane set button 517, the sagittal plane is shown as selected for the slicing section. More specifically, the slice plane of the imaging site can be selected by setting the imaging slice plane set button 517, to not only the sagittal plane shown in FIG. 5 but other two sectional planes, namely axial plane and coronal plane through adjustment by the imaging technician, and desired coil elements A to H can be selected from these three sectional planes.

Just beneath the axial plane setting window 511, the sagittal plane set window 512, and the coronal plane setting window 513 in the slice sectional display area 510, there are imaging slice position adjustment button 514, 515, 516 respectively, and by adjusting these imaging slice position adjustment button 514, 515, 516 the slice position based on each image slice sectional plane can be arbitrarily displaced to the point where the image will be most appropriate.

The low resolution image display area 520 has the capability of displaying the imaging information taken by the coil elements A to H at the time of low resolution imaging processing by using a plurality of coil elements A to H (eight channels from channel 1 to channel 8 in case of FIG. 5), corresponding to eight channels. More specifically, the low resolution image display area 520 has the capability of display the image taken by each coil elements A to H constituting the phased array coil 300 up to the number of coil elements (eight in this embodiment).

More practically, for the imaging plane displayed in the low resolution image display area 520, the slice plane will be decided (any of three imaging slice planes) by setting the imaging slice plane set button 517, and in any one slice plane having been set, the setting by either button of imaging slice position adjustment buttons 514, 515, 516 displays the sensitivity of each coil element with respect to the selected slice plane. The low resolution image display area 520 is also allowed displaying selectable remaining number of coil elements in the display screen, or a panel providing some advises.

The coil element selection image display area 530 comprises a coil element setting button 531 (accept) for ultimately defining either one or a combination of coil elements selected A to H, a cancel button 532 (cancel) for canceling the selected coil elements A to H, a coil element setting image display unit 533 (result) for displaying the image taken by the coil element selected, a standard coil selection button 534 (standard coil selection) for displaying the standard combination of coils, an additional coil selection 535 (add coil) for selecting a coil to add, and a remove coil selection button 536 (remove coil) for removing an unnecessary coil element.

More specifically, in the coil element selection image display area 530, the coil sensitivity can be displayed when any one of coil elements A to H selected by the imaging technician from within coil elements A to H, or a combination of coil elements A to H from within coil elements A to H is selected. The coil element setting image display unit 533 displays as image reconstructed from the image data by the coil elements A to H selected by the technician by using the actual image data obtained in the low resolution image processing step by the moving cradle method.

More practically, the coil element setting image display unit 533 (result) has the capability of displaying as result the image taken by a coil element based on the selected coil elements A to H by the imaging technician. In this embodiment, as shown in FIG. 5, two coil elements C and D of the cover 310 placed on top of the subject 190 and two coil elements G and H of the cover 310 placed at the bottom side of the subject 190 are indicated to be selected by the technician.

The standard coil selection button 534 has the capability of displaying the predetermined selection of coil elements as selected standard. More practically, the standard coil selection button 534 (standard coil selection) is provided for improving the operability by the technician, so as to select a combination of coil elements A to H in advance, in an arbitrary manner, which may be frequently used. The standard coil selection button 534 of the coil element selection image display area 530 shown in FIG. 5 displays "Upper4", indicating that four coils (coil elements A, B, C, and D) of the top side is selected from within eight coil elements A to H.

The additional coil selection 535 (add coil) and the remove coil selection button 536 (remove coil) are provided for the technician to add or remove a coil element to comply with his/her scanning plan.

More specifically, when clicking on the additional coil selection 535 (add coil) by mouse, any additional coil elements A to H will be displayed, and by selecting desired coil elements A to H, that coil element can be added to the selection as the technician needed, thereby the coil elements A to H are selected and set to an optimum combination.

By clicking on the remove coil selection button 536 (remove coil), any removable coil elements A to H are listed, and by selecting any of coil elements A to H, any unnecessary coil element can be removed appropriately.

For instance, when selecting coil elements C, D, E, and H from within coil elements A to H, the initial setting has the coil elements A, B, C, and D (the setting "Upper4" by the standard coil selection button 534), then the coil elements A and B will be removed by using the remove coil selection button 536 (remove coil) and then coil elements E and H will be added by the additional coil selection 535 (add coil).

(Procedure of Coil Element Selection Setting Process)

Figure 6:
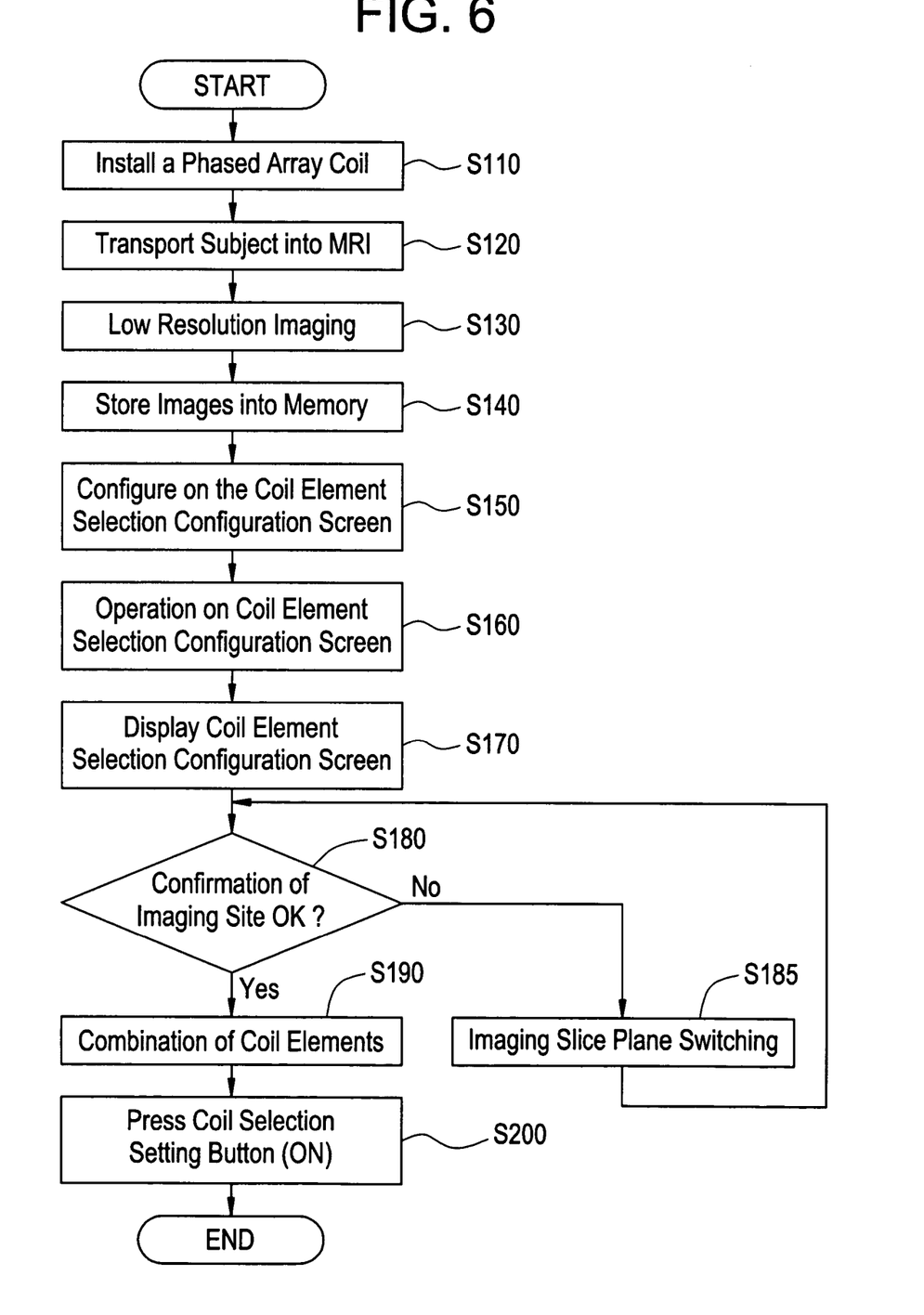
FIG. 6 shows a flow chart indicating the overall processing sequence of the coil element selection method in accordance with the present invention.

In the following description, the process in accordance with the inventive magnetic resonance imaging apparatus and coil element selection method will be described in greater details with reference to the flow chart shown in FIG. 6. The flow chart shown in FIG. 6 illustrates the operation procedure in sequence when selecting a coil element by the technician. In the flow chart shown in FIG. 6, we assumes the liver as the affected site of the subject 190, and the context of imaging the affected liver by the MRI apparatus 100.

Firstly, the preparation of MRI imaging by the MRI apparatus 100 should be complete. More practically, the preparation includes mounting the subject 190 on the table 191, and installing the phased array coil 300 to the part (in this case, abdomen) to be imaged of the subject 20 (see FIG. 3B).

Images are preliminary reconstructed by using the low resolution images taken at the time when the subject 190 is transported into the gantry 150 (magnet room) to provide the opportunity of determining intuitively which part of the subject 190 is imaged by the selected coil elements A to H.

As shown in FIG. 6, the phased array coil 300 is installed to the subject 190 (step S110), then the subject 190 will be transported into the MRI apparatus 100 by the transport drive of the table 191 (step S120). Thereafter, low resolution imaging process will be run (low resolution image processing) (step S130). As have been described above, the low resolution imaging process involves a plurality of coil elements A to H constituting the phased array coil 300 in all range of sensitivity, and all of the coil elements are used for high speed low resolution image scan. As have been described above, the low resolution image scan processing may use the preexisting low resolution image process.

More practically, this process takes an MRJ imaging session using all of the coil elements A to H by the low resolution imaging step, in order to confirm, from within a plurality of coil elements A to H, which coil elements A to H are placed where, and are capable to scan which part of the subject 190.

In step S130, MRI images processed in low resolution are sent from the machine room to the control room. The MRI images thus sent are once saved/stored in the memory 420 equipped in the operator console 400 (FIG. 1) (step S140), and incorporated (stored) into a database as required. When a sufficient memory space is present in the memory 420, the MRI image taken and processed in low resolution may be directly stored in the memory 430. Since the re is a marking indicating the center of coils on the middle of the phased array coil 300, when the subject 190 is transported into the magnet, the low resolution imaging scan is performed by the moving cradle method, from the beginning to the end of the sensitive range of the coil elements A to H of the phased array coil 300. The imaging information stored in the memory 420 may be redisplayed on the coil element selection display screen 500 (see FIG. 5) as appropriate as the element selection information when the technician has selected for the element selection.

From now on, the process proceeds to the setting operation on the coil element selection display screen 500 (see FIG. 5) (step S150). In other words the setting by the coil element selection display screen 500 will be performed (step S160). More practically, as have been described above, the image of the coil element selection display screen 500 can be displayed by setting the menu screen (see FIG. 4) displayed on the display unit 410 (see FIG. 1) (step S170).

The imaging technician sees a plurality of images displayed in the low resolution image display area 520 configured by the slice image data of either three patterns (axial, sagittal, or coronal) of the slice sectional display area 510 of the coil element selection display screen 500, to determine which one of coil elements A to H has the sensitivity range most efficiently approaching to the imaging site (liver in this embodiment) (see FIG. 5).

More practically, for the determination in step S180 "confirmation of imaging site OK?" if any of coil elements A to H of the coil elements A to H displays the appropriate imaging site, then the process proceeds to next step to combine the selected coils (step S190). Thereafter, in the combination process of selected coils, the most appropriate coil elements from within the coil elements A to H are combined, then to select the coil element setting button 531, and by pressing down (ON) the coil element setting button 531 the ultimate coil element selection is done (step S200).

As have been described above, in the low resolution image display area 520 of the coil element selection display screen 500, the sensitivity range in which the image screen of eight coil elements A to H is as a target is displayed, so that either the coil element or a combination of coil elements A to H when the image of target organ, the liver, is most clearly confirmed is specified and selected by pressing down (ON) the coil element setting button 531. The configuration of the coil elements A to H selected and set by the technician will be read into the MRI imaging system of the MRI apparatus 100 and based on the information (which coil elements A to H to be selected) the optimum scanning plan will be performed accordingly.

On the other hand, if the site to be imaged is not confirmed in either of image channels (channel 1 to channel 8) displayed in the low resolution image display area 520 (indicating that no appropriate imaging site is displayed) (negation of step S180), then the process proceeds to the imaging slice plane switching process (step S185). The imaging slice plane switching process switches the imaging slice plane by using again the imaging slice plane set button 517 (to other two slice planes sequentially) in case in which the imaging site cannot be recognized in the slice plane initially set by the imaging slice plane set button 517, and then the technician repeatedly confirms the scanned image corresponding to each slice plane. More practically if the liver is not seen in the initially set sagittal plane, then the technician switches the imaging slice plane to the axial plane and then to the coronal plane to find the location of the liver.

As have been described above, in accordance with the coil element selection method and magnetic resonance imaging apparatus of the present invention, preliminary low resolution imaging in the range sufficiently encompassing the coil sensitivity distribution by the phased array coil is performed, thus scanned low resolution images is stored in the memory, visual image reconstruction compliant to the desired scanning plan is performed by making use of information on the coil element selection (low resolution images of the subject) when the operator selects a coil element, and then facilitated visual recognition of which part of the subject is imaged by which selected coil is performed, whereby the imaging technician obtains the opportunity of coil element selection in a manner intuitive and easy to understand, to readily select coil elements compliant to the purpose, as well as to obtain the sensitivity range intended by the imaging technician, as a result the number of retaken sessions can be decreased in the scanning plan and the efficiency of MRI diagnosis can be improved.

The position of imaging site can be recognized in an efficient, positive, accurate manner by the visual coil selection, while the coil elements A to H and a combination of coil elements A to H can be simply and accurately selected, which may perform the scan of imaging site at a high sensitivity from a plurality of coil elements A to H which constitutes the phased array coil 300.

The scanned image by an optimum coil element and a combination of coil elements from within a plurality of coil elements A to H which constitute the phased array coil 300 can be obtained and the operator, based on that data, may select the coil element.

In the preferred embodiment described above, although the moving cradle method is applied in order to obtain a vast range of data that is necessary for the coil element selection, the present invention can equally be applied to not only the moving cradle method but also any conventional MRI scanning method.

Many widely different embodiments of the invention may be configured without departing from the spirit and the scope of the present invention. It should be understood that the present invention is not limited to the specific embodiments described in the specification, except as defined in the appended claims.

The invention claimed is:

1. A coil element selection method of a magnetic resonance imaging apparatus for generating a magnetic resonance image based on magnetic resonance signals emitted from a site being imaged of a subject through a phased array coil to be mounted onto the subject and having a plurality of coil elements embedded, said method comprising:
a low resolution imaging step for imaging at a low resolution by using the plurality of coil elements to generate a plurality of low resolution images;
displaying the plurality of low resolution images on a coil element selection display screen of a display unit;
an imaging coil element selection step for selecting on the coil element selection display screen, by an operator, at least one coil element for the site to be imaged, said selection based on the plurality of low resolution images taken in said low resolution imaging step; and
a coil element extraction step for extracting the at least one coil element selected in said imaging coil element selection step.

2. A coil element selection method according to claim 1, wherein:
said imaging coil element selection step includes selecting a combination of the plurality of coil elements with suitable imaging sensitivity with respect to the imaging site of said subject.

3. A coil element selection method according to claim 1, further comprising:
an imaging condition setting step for setting an imaging condition when imaging with the at least one coil element extracted in said coil element extraction step.

4. A coil element selection method according to claim 1, further comprising:
an imaging slice plane setting step for allowing selection of setting in any one imaging slice plane of axial, sagittal, and coronal with respect to said subject.

5. A coil element selection method according to claim 1, wherein:
said low resolution imaging step includes a function of performing the process of imaging the sensitivity area by the plurality of coil elements.

6. A coil element selection method according to claim 1, wherein:
said low resolution imaging step includes a function of using an imaging method of moving cradle.

7. A magnetic resonance imaging apparatus, which generates a magnetic resonance image based on the magnetic resonance signals emitted from the imaging site of a subject by means of a phased array coil to be mounted onto said subject and having a plurality of coil elements, said magnetic resonance imaging apparatus comprising:
a low resolution imaging device for imaging at a low resolution by using said plurality of coil elements to generate a plurality of low resolution images;
an imaging coil element selection device for selecting at least one imaging coil element which is suitable for the imaging site, said imaging coil element selection device comprises a display unit operatively coupled to said low resolution imaging device, said display unit configured to display said plurality of low resolution images on a coil element selection display screen, said display unit also configured to display at least one selection, by an operator, corresponding to one coil element from said plurality of coil elements; and
a coil element extraction device for extracting the at least one coil element selected by said imaging coil element selection device.

8. A magnetic resonance imaging apparatus according to claim 7, wherein:
said imaging coil element selection device enables selecting a combination of said plurality of coil elements with suitable imaging sensitivity with respect to the imaging site of said subject.

9. A magnetic resonance imaging apparatus according to claim 7, further comprising:
an imaging condition setting device for setting an imaging condition for imaging with the at least one coil element extracted in said coil element extraction device.

10. A magnetic resonance imaging apparatus according to claim 7, further comprising:
an imaging slice plane setting device for allowing selection of setting in any one of axial, sagittal, and coronal with respect to said subject.

11. A magnetic resonance imaging apparatus according to claim 10, further comprising: a slice section display device for displaying the slice section imaged in any one of imaging slice planes set by said imaging slice plane setting device.

12. A magnetic resonance imaging apparatus according to claim 10, wherein:
said imaging slice plane setting device includes a function of setting imaging position to the optimum position based on the imaging slice plane set by any one imaging slice plane of axial, sagittal, and coronal.

13. A magnetic resonance imaging apparatus according to claim 7, wherein:
said low resolution imaging device includes a function of performing the process of imaging a sensitivity area by said plurality of coil elements.

14. A magnetic resonance imaging apparatus according to claim 7, wherein:
said low resolution imaging device includes a function of using the imaging method of moving cradle together.

15. A magnetic resonance imaging apparatus according to claim 7, further comprising:
a standard coil element selection device for selecting a coil element configuration, which is the reference to said coil elements.

16. A magnetic resonance imaging apparatus according to claim 15, further comprising:
a coil element display device for displaying a configuration of the standard coil element being set by said standard coil element selection device.

* * * * *